(12) United States Patent
Biber et al.

(10) Patent No.: US 7,583,083 B2
(45) Date of Patent: Sep. 1, 2009

(54) RADIO-FREQUENCY ACQUISITION DEVICE FOR A MAGNETIC RESONANCE TOMOGRAPHY APPARATUS

(75) Inventors: Stephan Biber, Erlangen (DE); Klaus Huber, Effaltrich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/179,109

(22) Filed: Jul. 24, 2008

(65) Prior Publication Data

US 2009/0027054 A1 Jan. 29, 2009

(30) Foreign Application Priority Data

Jul. 24, 2007 (DE) .................. 10 2007 034 492

(51) Int. Cl.
*G01V 3/00* (2006.01)

(52) U.S. Cl. ........................ 324/318; 324/307

(58) Field of Classification Search ......... 324/300–322; 600/407–445
See application file for complete search history.

(56) References Cited

U.S. PATENT DOCUMENTS

| 5,208,537 | A | 5/1993 | Rietsch et al. |
| 6,084,410 | A | 7/2000 | Nistler |
| 6,841,996 | B2 * | 1/2005 | Madio et al. ............... 324/303 |
| 7,123,010 | B2 * | 10/2006 | Krockel .................... 324/318 |
| 7,358,737 | B2 * | 4/2008 | Hoult ....................... 324/322 |
| 2003/0203717 | A1 * | 10/2003 | Chuprun et al. ........... 455/12.1 |

* cited by examiner

*Primary Examiner*—Brij B Shrivastav
(74) *Attorney, Agent, or Firm*—Schiff Hardin LLP

(57) ABSTRACT

A radio-frequency acquisition device for a magnetic resonance tomography apparatus has at least one reception antenna for acquisition of magnetic resonance signals and with an amplifier device to amplify acquired magnetic resonance signals. The amplifier device has an input transistor and a transformation device to transform the source impedance of the acquisition antenna into a source impedance adapted to the input transistor, and wherein the transformation device can be switched between at least two transformation ratios.

12 Claims, 2 Drawing Sheets

RADIO-FREQUENCY ACQUISITION DEVICE FOR A MAGNETIC RESONANCE TOMOGRAPHY APPARATUS

BACKGROUND OF THE INVENTION

1. Field of the Invention

The present invention concerns a radio-frequency acquisition device for a magnetic resonance tomography apparatus with at least one reception antenna to acquire magnetic resonance signals and with an amplifier device to amplify the acquired magnetic resonance signals.

2. Description of the Prior Art

For examination of a human body part it is known to introduce the body part to be examined into a homogeneous magnetic field, known as the basic field. The magnetic field causes an alignment of the nuclear spins of atomic nuclei in the body part, in particular of hydrogen atomic nuclei (protons) bound to water. These nuclei are excited to a precession movement by irradiated radio-frequency excitation pulses. After the end of an excitation pulse, the atomic nuclei precess with a frequency that depends on the strength of the basic field and, due to their spins, settle again into the preferred direction predetermined by the basic field after a predetermined relaxation time. The atomic nuclei thereby emit radio-frequency signals, what are known as magnetic resonance examination signals. An image can be generated from the spatial spin density or the distribution of the relaxation times within a body slice by computational or measurement analysis of the magnetic resonance signals. The association of the magnetic resonance signals (detectable as a result of the precession movement) with the respective location of their formation ensues by the application of linear gradient fields. For this purpose, suitable gradient fields are superimposed on the basic field and are controlled such that an excitation of the nuclei ensues only in a slice to be imaged. An image depiction based on these physical effects is known as magnetic resonance tomography (MRT).

The known design of an acquisition system of such a magnetic resonance tomography apparatus is shown substantially in FIG. 3. There are systems that have a number of additional components, for example detuning units arranged on the reception antenna in order to decouple the antennas from one another given use of a second antenna (as described in DE 298 04 339 U1) or adaptation circuits in order to compensate for incorrect adaptation of the antenna caused by the patient body (as described in DE 40 35 994 A1). For better clarity, however, only the components essential for later explanation of the invention are shown in FIG. 3.

Usually local surface coils (local coils), known as loop antennas, or array arrangements constructed from multiple loop antennas are used as a reception antenna 31 to acquire the magnetic resonance signals from the examination subject.

The magnetic resonance signals generated by the excited atomic nuclei induce a voltage $U_{ind}$ in the acquisition antenna 31 that is then amplified in a low-noise preamplifier 32 (LNA, Low Noise Amplifier) and conducted via a bed cable 33 to an additional amplifier device 34. The magnetic resonance signals (which are thus amplified twice) are then relayed via a further conductor 35 to an acquisition electronic 36 wherein which they are processed further.

Systems known as high field systems operated with basic field strengths at three Tesla and more, and are used to improve the signal-to-noise ratio, in particular to generate high-resolution slice representations.

Theoretically, a quadrupling of the power of the receivable magnetic resonance signals results by a doubling of the basic field strength. For example, typically maximum signal powers of −27 dBm occur at the input of the preamplifier given a basic field strength of 1.5 Tesla; the maximum signal power at the input of the preamplifier is typically −21 dBm given a basic field strength of 3 Tesla.

The value range of the signal powers of the acquired magnetic resonance signals or the amplitudes of the acquired magnetic resonance signals present at the input of the preamplifier thus increases due to the increase of the maximum basic field strengths used.

The demands on the preamplifier increase due to the increase of the value range of the signal powers present at the input of the preamplifier. This should be able to operate optimally without distortion to amplify magnetic resonance signals across the entire possible signal power value range, thus from thermal noise up to the maximum signal power. This is no longer ensured in a satisfactory manner given the high maximum magnetic fields (and the high maximum signal powers associated therewith) in modern high field systems.

To mitigate the problem, in particular to increase the dynamic range of the acquisition system, it is known to design the additional amplifier device 34 shown in FIG. 3 such that it can be switched by a control signal, such that magnetic resonance signals with low signal power (in particular low maximum power) are more strongly amplified (high gain) than magnetic resonance signals with relatively high signal power, in particular high maximum power.

This solution using the preamplifier has previously not been considered to lead to the desired goal. As shown in FIG. 4, in an input stage of the preamplifier 42 the source impedance $Z_{loop}$ of the reception antenna 41 is transformed by a transformation device 47 into a source impedance adapted to the input transistor 49 of the preamplifier 42. $Z_{in}$ is the amplifier input impedance.

The transformation device 47 has a capacitor C and an inductor L. The amplification unit 48 of the preamplifier 42 can have additional elements (in particular transistors) in addition to the input transistor 49.

The source impedance $Z_{loop}$ of the reception antenna 41 is transformed by the transformation device 47, in particular into the optimal source impedance $Z_{opt}$ for the low-noise input transistor 49. Under this boundary condition, the voltage rise $U_{GS}$ is present at the gate-source path of the input transistor 49 given a predetermined source power (and therefore also the maximum allowable source power from the reception antenna).

In order to now increase the dynamic range of the preamplifier, the rest current in the low noise input transistor (typically a GaAs field effect transistor) can be increased. This measure, however, runs against a limit when the power loss is significantly increased that the input transistor is damaged or the heat development leads to a noticeable negative effect on the patient comfort. Although the possible damage to the input transistor could be prevented by the use of multiple individual semiconductors, the patient stress due to the heat input would still exist.

As an alternative, the acquired magnetic resonance signal can be attenuated by an attenuation element between the reception antenna and the preamplifier, but this would lead to an unwanted, strong increase of the noise ratio of the acquisition chain.

SUMMARY OF THE INVENTION

An object of the present invention is to provide a radio-frequency acquisition device for a magnetic resonance tomography apparatus with which magnetic resonance signals are acquired and amplified with low noise across a large signal power range.

The above object is achieved in accordance with the invention by a radio-frequency acquisition device having a control unit configured to switch an amplifier device (in particular the transformation device of a preamplifier device) between at least two different transformation ratios dependent on the magnetic resonance signals received or to be amplified. A large value range (possible at the input of the amplifier device) of the signal power (acquisition power range of the amplifier device) is thereby converted into a relatively smaller value range of the signal power (acquisition power range of the input transistor) that is possible at the input transistor of the amplifier device.

The invention is thus based on switching a preamplifier (in particular the transformation device in the input stage of the preamplifier) between at least two different transformation ratios by means of a suitable control device, depending on the magnetic resonance signals acquired or to be amplified, in particular on the signal power of the acquired magnetic resonance signals.

A preferred radio-frequency acquisition device for a magnetic resonance tomography apparatus has at least one reception antenna to acquire magnetic resonance signals (acquisition signals). The acquired magnetic resonance signals are amplified by an amplifier device, wherein the amplifier device has at least one input transistor and a transformation device for transformation of the source impedance of the reception antenna into a source impedance adapted (matched) to the input transistor. The transformation device can be switched between at least two transformation ratios (transformation degrees), in particular between a first (small) and a second (large) transformation ratio.

The amplifier device comprises or is advantageously a low noise preamplifier (LNA). This can naturally have further components (in particular further transistors) in addition to the input transistor.

If the transformation device is switched to the small transformation ratio, a small degree of amplification (low gain) is caused by the amplifier device. In contrast to this, if the transformation device is switched to the large transformation ratio, a large degree of amplification (high gain) is caused by the amplifier device.

In the case of a small transformation ratio, magnetic resonance signals with high signal power can thereby be converted into magnetic resonance signals with a signal voltage that is less than or equal to the maximum allowable input voltage of the input transistor. A high maximum allowable input power can thereby be achieved for the amplifier device.

The control device is configured (for example programmed) and coupled with the transformation device such that the switching between two transformation ratios ensues indirectly or directly depending on the acquired magnetic resonance signals.

For this purpose, for example, measurement values of the signal power of the current magnetic resonance signals or values correlating with this are supplied to the control device. For example, the switch-over can ensue automatically when the signal power of the acquired or amplified magnetic resonance signals exceeds or, respectively, falls below a predetermined limit value. However, from experience it can also be established before the start of the measurement whether the level to be expected in the high gain mode can be processed or whether the low gain mode should be switched to for this. A switch-over is also likewise possible in the short "rest phases" of an MR acquisition which normally always consist of multiple transmission and reception cycles anyway.

The larger, noise-optimal transformation ratio is in particular switched to given magnetic resonance signals of low signal power, in particular given a signal power lying below a predetermined limit value. This leads to stronger amplification by the amplifier device; magnetic resonance signals of greater signal voltage are supplied to the input transistor compared to the use of a smaller transformation ratio. The limit value, as of when a signal is considered low or high, ultimately depends both on the design of the system (in particular of the preamplifier) and on specifications of the system manufacturer or universal standards. As is known, an amplifier operates without distortion only up to a specific limit. For example, a signal in which the gain compression of the amplifier lies below a predetermined limit could therefore be viewed as a low signal, wherein the limit could be set at, for example, 0.1 dB. Above such a limit, the signal could be viewed as too strongly distorted and therefore as too large.

According to a preferred embodiment, an additional, switchable amplifier device downstream from the aforementioned amplifier device is controlled by the control device. For this purpose, the control device is configured so that the second amplifier device is also switched over (in particular between two amplification levels) with the switch-over of the transformation device of the first amplifier device, in particular via the same control signal. The second amplifier device does not necessarily have to be spatially separated from the first amplifier device; rather, it can be arranged in a second stage in the first amplifier device.

The switching advantageously ensues such that a greater amplification is achieved by both amplifier devices given received or amplified magnetic resonance signals of lower signal power than given received or amplified magnetic resonance signals of high signal power.

The transformation device is advantageously executed such that a switch-over between the transformation ratios is neutral with regard to the phase of the amplifier input impedance. A decoupling between individual loops of the reception antenna can thereby be ensured, in particular when this is executed as an array reception antenna.

The transformation device is advantageously executed such that losses caused by the transformation device (in particular due to ohmic resistances) are essentially effective only in the switch setting of the transformation device that produces the small transformation ratio, i.e. are more effective at least in the switch setting producing the small transformation ratio than in the switch position producing the large transformation ratio. In this case, magnetic resonance signals with large signal power exist which can also still be processed further with sufficient quality even given small losses in the transformation device. By contrast, magnetic resonance signals with low signal power could already be too strongly affected to still enable an acceptable further processing, even given small losses in the transformation device.

For this, the transformation device is advantageously executed such that a switching between the transformation ratios is based on a switching of at least one switching diode, particularly preferably a PIN diode (positive intrinsic negative diode).

For example, if the transformation device is based on a high-pass resonance transformation circuit, a capacitor can be connected via a first switching diode (in particular PIN diode) parallel to the capacitor of the high-pass resonance transformation circuit to switch over to the small transformation ratio, and an inductor parallel to the inductor of the high-pass resonance transformation circuit can be connected via a second switching diode (in particular PIN diode).

The transformation device is preferably executed such that the source impedance (caused by the transformation device given a small transformation ratio) adapted to the input transistor deviates more strongly from the optimal source impedance of the input transistor than the source impedance (caused by the transformation device given a large transformation ratio) adapted to the input transistor. The source impedance caused by the transformation device given a large transformation ratio and adapted to the input transistor in particular significantly corresponds to the optimal source impedance for the input transistor, or the source impedance adapted to the input transistor is equal to the optimal source impedance for the input transistor. Given magnetic resonance signals of low signal power, and therefore given the large transformation ratio, it is particularly important that the source impedance of the reception antenna is essentially transformed into the optimal source impedance of the input transistor. Only then is the noise adaptation of the input transistor optimal. In contrast to this, given magnetic resonance signals of high signal power the source impedance of the reception antenna can be transformed into a source impedance whose magnitude is smaller than the optimal source impedance of the input transistor. In this case an optimal noise adaptation is not absolutely necessary. The maximum allowable input power for low-distortion operation of the amplifier device can thereby be increased at the cost of a non-optimal noise adaptation of the input transistor in the case of high signal powers.

Given identical power loss consumption by the input transistor, the allowable input power of the amplifier device can be significantly increased by switching the transformation ratio. The degradation of the noise ratio given magnetic resonance signals with high signal power or, respectively, given a small transformation ratio due to the incorrect noise adaptation of the input transistor is slight and can be tolerated given magnetic resonance signals with high signal power.

Due to the switching capability of the amplifier device, transistors with lower input noise ratio can be used in the amplification unit without having to accept a reduction of the dynamic of the entire system. Given small transformation ratio (low gain), the dynamic range for large input powers can be extended at the upper end while given large transformation ratio (high gain), a further reduction of the input noise ratio of the amplifier device (and therefore an improvement of the total sensitivity of the acquisition chain) is possible.

The radio-frequency acquisition device according to the invention can be used in magnetic resonance tomography apparatuses of the most different construction. As already mentioned, it has been particularly advantageous in what are known as high field systems which operate with a particularly high basic magnetic field of three Tesla or more.

DESCRIPTION OF THE PREFERRED EMBODIMENTS

Figure 1:
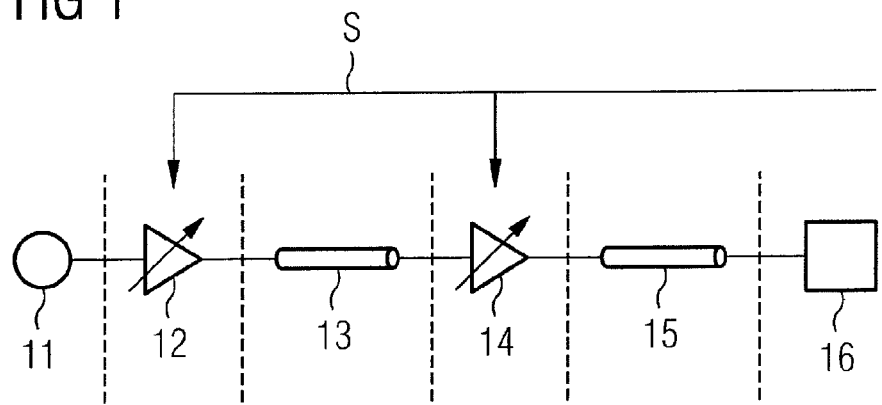
FIG. 1 is a simplified block diagram of a magnetic resonance tomography acquisition chain with switchable preamplifier.
Figure 3:
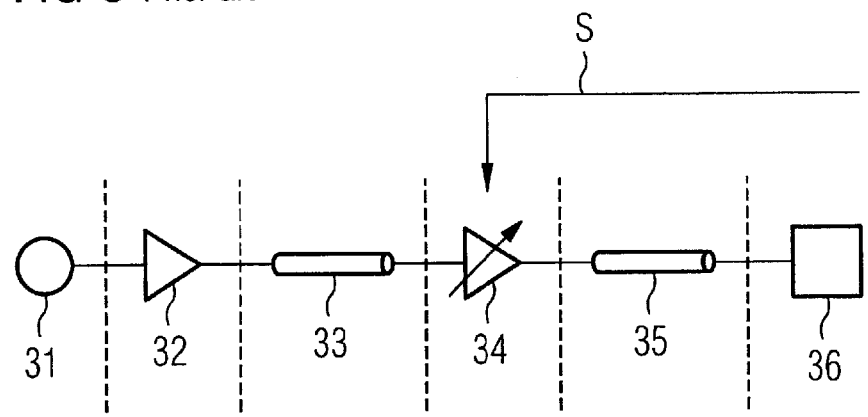
FIG. 3 is a simplified block diagram of a magnetic resonance tomography acquisition chain (prior art).
Figure 4:
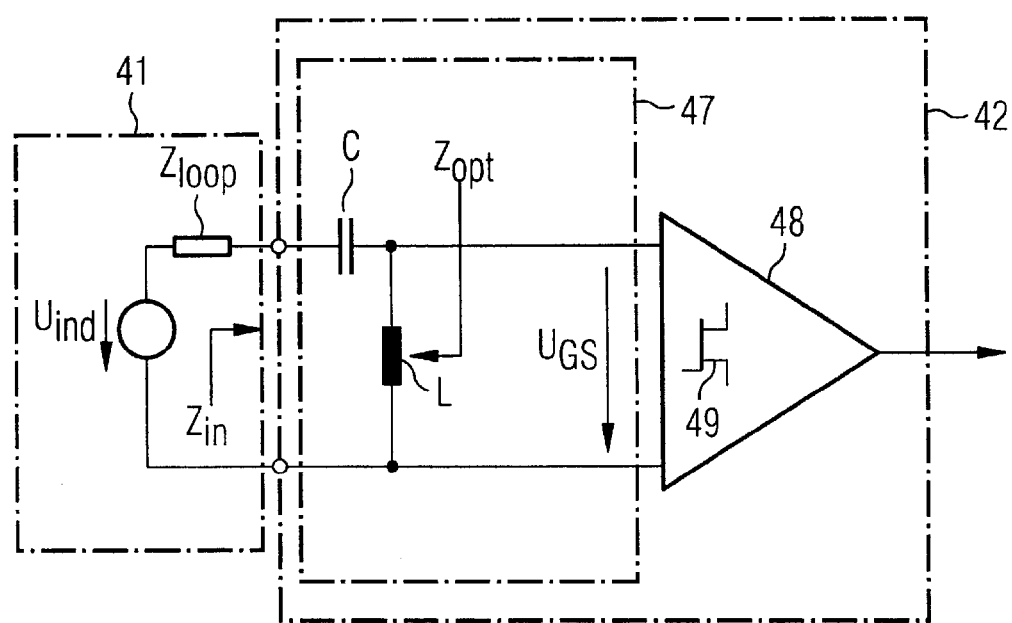
FIG. 4 is a simplified representation of a radio-frequency acquisition device (prior art).

FIG. 1 shows a magnetic resonance tomography acquisition chain that differs from the magnetic resonance tomography acquisition chain according to FIG. 3 in that the preamplifier 12 is now executed such that it can be switched via the same control signal as the further amplifier 14 or a control signal output in parallel.

Both amplifier devices 12, 14 can be simultaneously switched either to "high gain" or "low gain" via the control signal or the control signals.

An array antenna is used as a reception antenna 11 to acquire the magnetic resonance signals of an examination subject. The acquired magnetic resonance signals are amplified by the preamplifier 12 and conducted via a bed cable 13 to the further amplifier device 14 (here an amplifier that can be switched in terms of its amplification). The magnetic resonance signals so amplified are finally relayed via a further conductor 15 to an acquisition electronic 16.

Figure 2:
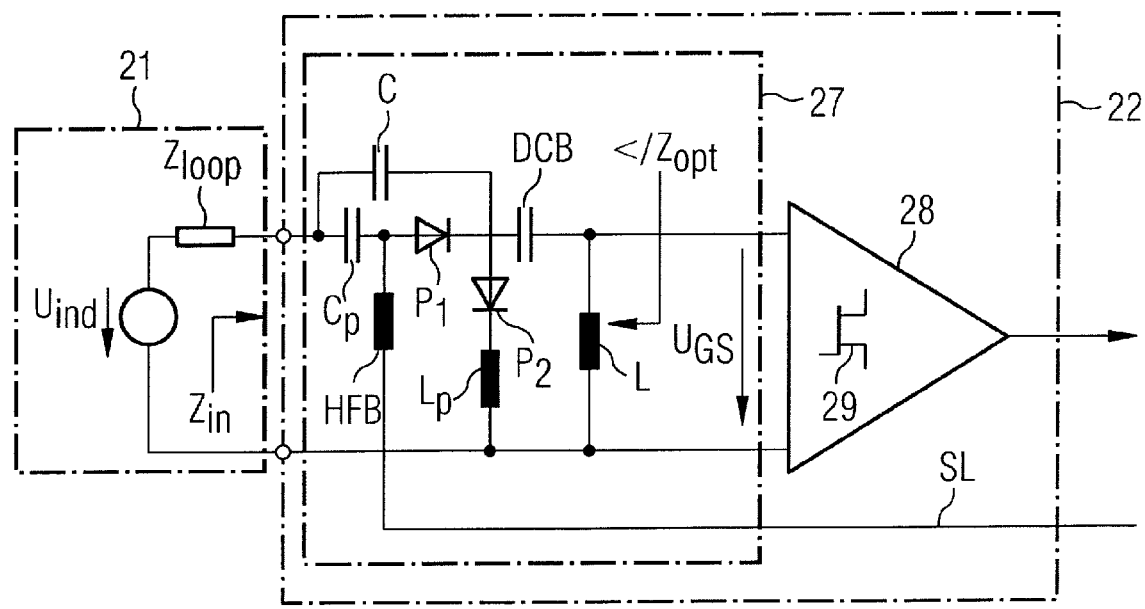
FIG. 2 is a simplified representation of a radio-frequency acquisition device with switchable preamplifier.

FIG. 2 again shows an acquisition antenna 21 with the source impedance $Z_{loop}$ for acquisition of magnetic resonance signals. The source impedance $Z_{loop}$ of the acquisition antenna 21 is transformed via a transformation device 27 in the input stage of the preamplifier 22 into a source impedance adapted to the input transistor 29 of the amplification unit 28 of the preamplifier 22.

The transformation device 27 can be switched between two transformation ratios. To realize the larger transformation ratio (given magnetic resonance signals of low signal power), the transformation device 27 has a capacitor C (series C) and an inductor L (parallel L).

A blocking voltage is present at the PIN diodes P1, P2, which is why the further capacitor CP and the further inductor LP are not active. In this case the PIN diodes P1, P2 have no negative influence on the transformation device 27. The capacitor C and the inductor L are designed such that the source impedance $Z_{loop}$ of the acquisition antenna 21 is transformed into the optimal source impedance for the input transistor 29.

If, through an appropriate configuration of a control device of a measurement device (not shown) it is established (for example in the acquisition electronic) that magnetic resonance signals of high signal power are acquired, a control or switch-over signal is output by the control device. For example, a current of 10 mA is thereby applied via a control line SL. This current causes both PIN diodes $P_1$, $P_2$ to be switched through and become conductive. The further capacitor $C_P$ is thereby connected parallel to the capacitor C and the further inductor $L_P$ is connected parallel to the inductor L. The series capacitance of the high-pass resonance transformation circuit is thereby increased and the parallel inductance of the high-pass resonance transformation circuit is reduced, whereby the transformation ratio of the transformation device 27 is reduced. The source impedance $Z_{loop}$ of the reception antenna 21 is transformed by the transformation device 27 to a source impedance that is smaller than the optimal source impedance for the input transistor 29.

The further capacitor DCB and the further inductor RFB (likewise shown) merely serve as a "DC block" DCB and an RF block" RFB, respectively, for the decoupling of the transformation device 27 relative to interfering signals that can arise in the control device, which supplies the switch-over signal or the current via the control line.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency acquisition device for magnetic resonance tomography comprising:
    a reception antenna configured for acquisition of magnetic resonance signals from a subject;
    an amplifier device connected to said reception antenna that amplifies the acquired magnetic resonance signals, said amplifier device comprising an input transistor and a transformation device that transforms a source impedance of the reception antenna into a source impedance matched to the input transistor, and said transformation device being configured for switching between at least two transformation ratios; and
    a control unit coupled to the transformation device and configured to operate said transformation device to switch between said at least two transformation ratios dependent on the magnetic resonance signals acquired by said reception antenna.

2. A radio-frequency acquisition device as claimed in claim 1 wherein said at least two transformation ratios include a larger transformation ratio and a smaller transformation ratio, and wherein said control device is configured to identify acquisition by said reception antenna of magnetic resonance signals of a low signal power and, upon identification of said acquisition of magnetic resonance signals of a low signal power, to switch operation of said transformation device to said larger transformation ratio.

3. A radio-frequency acquisition device as claimed in claim 1 wherein said amplifier device comprises a low-noise preamplifier.

4. A radio-frequency acquisition device as claimed in claim 1 wherein said amplifier device is a first amplifier device and comprising a second amplifier device, identical to said first amplifier device, connected in series with said first amplifier device and controlled by said control unit, and wherein said control unit is configured to switch the transformation device of said second amplifier device simultaneously with switching of the transformation device of said first amplifier device.

5. A radio-frequency acquisition device as claimed in claim 1 wherein said source impedance of said input transistor has a phase associated therewith, and wherein said transformation device is configured to switch between said at least two transformation ratios in a neutral manner with respect to said phase.

6. A radio-frequency acquisition device as claimed in claim 1 wherein said transformation device is operable with a larger transmission ratio and with a smaller transmission ratio, and wherein said transformation device is configured to exhibit a loss only when switched by said control unit to operate with said smaller transformation ratio.

7. A radio-frequency acquisition device as claimed in claim 1 wherein said transformation device comprises at least one switching diode that switches said transformation device between said at least two transformation ratios.

8. A radio-frequency acquisition device as claimed in claim 1 wherein said transformation device comprises a high-pass resonance transformation circuit.

9. A radio-frequency acquisition device as claimed in claim 8 wherein said high-pass resonance transformation circuit comprises a circuit capacitor, and wherein said transformation device comprises a further capacitor and a first switching diode operated by said control unit to connect said further capacitor in parallel with said circuit capacitor to switch said transformation device to a smaller of said transformation ratios, and wherein said high-pass resonance transformation circuit comprises a circuit inductor and wherein said transformation device comprises a further inductor and a second switching diode operable by said control unit to connect said further inductor in parallel with said circuit inductor.

10. A radio-frequency acquisition device as claimed in claim 1 wherein said input transistor has an optimal source impedance, and wherein said transformation device is configured to cause a source impedance produced by said transformation device with a smaller of said transformation ratios to deviate more from said optimal source impedance of said input transistor than a source impedance caused by said transformation device with a larger of said transformation ratios.

11. A radio-frequency acquisition device as claimed in claim 1 wherein said input transistor has an optical source impedance, and wherein said transformation device is configured to cause a source impedance for a larger of said transformation ratios to substantially correspond to said optimal source impedance of said input transistor.

12. A magnetic resonance tomography apparatus comprising:
    a magnetic resonance data acquisition device configured to receive a subject therein to obtain magnetic resonance signals therefrom; and
    said magnetic resonance data acquisition device comprising a radio-frequency device, said radio-frequency device comprising a reception antenna configured to receive said magnetic resonance signals from said subject, an amplifier device connected to said reception antenna that amplifies the received magnetic resonance signals, said amplifier device comprising an input transistor and a transformation device that transforms a source impedance of the reception antenna into a source impedance matched to the input transistor, and said transformation device being configured for switching between at least two transformation ratios, and a control unit coupled to the transformation device and configured to operate said transformation device to switch between said at least two transformation ratios dependent on the magnetic resonance signals received by said reception antenna.

* * * * *